United States Patent
Chan et al.

(10) Patent No.: US 9,685,592 B2
(45) Date of Patent: Jun. 20, 2017

(54) MINIATURE SURFACE MOUNT DEVICE WITH LARGE PIN PADS

(75) Inventors: Chi Keung Chan, Sheung Shui (HK); Chak Hau Pang, Fanling (HK); Fei Hong Li, Huizhou (CN); Yue Kwong Lau, Laguna (HK); Jun Zhang, Huizhou (CN); David Todd Emerson, Chapel Hill, NC (US)

(73) Assignee: Cree Huizhou Solid State Lighting Company Limited (CN)

( * ) Notice: Subject to any disclaimer, the term of this patent is extended or adjusted under 35 U.S.C. 154(b) by 1039 days.

(21) Appl. No.: 13/153,888

(22) Filed: Jun. 6, 2011

(65) Prior Publication Data

US 2012/0104427 A1    May 3, 2012

Related U.S. Application Data

(63) Continuation-in-part of application No. 12/321,059, filed on Jan. 14, 2009, now Pat. No. 8,368,112, and a continuation-in-part of application No. 12/939,096, filed on Nov. 3, 2010, and a continuation of application No. PCT/CN2011/000335, filed on Mar. 2, 2011.

(51) Int. Cl.
| | |
|---|---|
| *H01L 33/48* | (2010.01) |
| *H01L 33/62* | (2010.01) |
| *H01L 23/498* | (2006.01) |
| *H01L 25/075* | (2006.01) |
| *H01L 33/64* | (2010.01) |

(52) U.S. Cl.
CPC ......... *H01L 33/486* (2013.01); *H01L 33/647* (2013.01); *H01L 23/49861* (2013.01); *H01L 25/0753* (2013.01); *H01L 33/62* (2013.01); *H01L 33/642* (2013.01); *H01L 2224/48091* (2013.01); *H01L 2224/48247* (2013.01)

(58) Field of Classification Search
USPC ...................................................... 257/89, 98
See application file for complete search history.

(56) References Cited

U.S. PATENT DOCUMENTS

| | | |
|---|---|---|
| 7,435,143 B2 | 10/2008 | Anderlini |
| D585,848 S | 2/2009 | Kim et al. |
| D586,302 S | 2/2009 | Kim et al. |

(Continued)

FOREIGN PATENT DOCUMENTS

| | | |
|---|---|---|
| CN | 101388161 A | 3/2009 |
| JP | 2004-335740 A | 11/2004 |

(Continued)

OTHER PUBLICATIONS

Search Report issued in international application No. PCT/CN2011/000335, mailed Jun. 16, 2011 (10 pages).

(Continued)

*Primary Examiner* — Raj R Gupta
(74) *Attorney, Agent, or Firm* — Brinks Gilson & Lione (57) ABSTRACT

One embodiment of the surface mount LED package includes a lead frame and a plastic casing at least partially encasing the lead frame. The lead frame includes a plurality of electrically conductive chip carriers. There is an LED disposed on each one of the plurality of electrically conductive chip carriers. A profile height of the surface mount LED package is less than about 1.0 mm.

32 Claims, 4 Drawing Sheets

(56) References Cited

U.S. PATENT DOCUMENTS

| | | | |
|---|---|---|---|
| D606,948 S | 12/2009 | Hussell et al. | |
| D606,950 S | 12/2009 | Ariizumi | |
| D611,012 S | 3/2010 | Hsieh | |
| D615,504 S | 5/2010 | Keller et al. | |
| D626,257 S | 10/2010 | Pickard | |
| D633,099 S | 2/2011 | Van de Ven et al. | |
| 7,888,852 B1 | 2/2011 | Sung | |
| D659,657 S | 5/2012 | Hussell | |
| 8,217,414 B2 * | 7/2012 | Hayashi | 257/99 |
| D667,801 S | 9/2012 | Joo et al. | |
| 8,269,244 B2 | 9/2012 | Hussell | |
| 2002/0070387 A1 | 6/2002 | Wang et al. | |
| 2005/0127816 A1 | 6/2005 | Sumitani | |
| 2008/0023714 A1 | 1/2008 | Chae et al. | |
| 2008/0111148 A1 | 5/2008 | Zimmerman | |
| 2008/0151143 A1 | 6/2008 | Li et al. | |
| 2008/0290353 A1 * | 11/2008 | Medendorp et al. | 257/89 |
| 2009/0072251 A1 * | 3/2009 | Chan et al. | 257/89 |
| 2009/0129085 A1 * | 5/2009 | Aizar et al. | 362/247 |
| 2009/0283781 A1 * | 11/2009 | Chan et al. | 257/89 |
| 2010/0102345 A1 * | 4/2010 | Kong et al. | 257/98 |
| 2010/0155748 A1 | 6/2010 | Chan et al. | |
| 2010/0308352 A1 | 12/2010 | Liao et al. | |
| 2011/0001149 A1 | 1/2011 | Chan et al. | |
| 2011/0037083 A1 | 2/2011 | Chan et al. | |
| 2011/0248293 A1 * | 10/2011 | Chan et al. | 257/89 |
| 2011/0291152 A1 | 12/2011 | Liaw | |

FOREIGN PATENT DOCUMENTS

| | | | |
|---|---|---|---|
| WO | WO2008081696 | * 7/2008 | |
| WO | WO 2008130140 A1 * | 10/2008 | H01L 33/62 |

OTHER PUBLICATIONS

Written Opinion issued in international application No. PCT/CN2011/000335, mailed Jun. 16, 2011 (9 pages).
Search Report issued in international application No. PCT/CN2011/000334, mailed Jun. 9, 2011 (8 pages).
Written Opinion issued in international application No. PCT/CN2011/000334, mailed Jun. 9, 2011 (9 pages).
Cree® PLCC4 2-in-1 SMD LED CLM4S-DKB Data Sheet, Copyright 2008-2009 Cree, Inc. (8 pages).
Cree® PLCC6 3-in-1 SMD LED CLP6R-FKW Data Sheet, Copyright 2009 Cree, Inc. (9 pages).
Cree® TR2432™ LEDs Data Sheet CxxxTR2432-S-xx00, Copyright 2008 Cree, Inc. (6 pages).
For Cree H.K Only PN-series AlGaInP LED chip, Copyright 2009 Epistar Corporation (2 pages).
For Cree Hong Kong Limited. Phoenix N-series AlGaInP LED chip, Copyright 2007 Epistar Corporation (2 pages).
U.S. Appl. No. 12/758,702, filed Apr. 12, 2010, entitled "Surface Mount Device Thin Package" (58 pages).
Drawings for design U.S. Appl. No. 29/360,791, filed Apr. 30, 2010 (4 pages).
U.S. Appl. No. 61/369,565, filed Jul. 30, 2010, entitled "Water Resistant Surface Mount Device" (59 pages).
U.S. Appl. No. 12/939,096, filed Nov. 3, 2010, entitled "White Ceramic LED Package" (43 pages).
U.S. Appl. No. 12/957,225, filed Nov. 30, 2010, entitled "Waterproof Surface Mount Device Package and Method" (48 pages).
Office Action to U.S. Appl. No. 29/386,583, dated Oct. 4, 2012, 9p.
Notice of Allowance to U.S. Appl. No. 29/386,583, dated Aug. 23, 2013, 9p.

* cited by examiner

MINIATURE SURFACE MOUNT DEVICE WITH LARGE PIN PADS

RELATED APPLICATIONS

This application is a continuation-in-part of co-pending U.S. application Ser. No. 12/321,059, filed Jan. 14, 2009, and U.S. application Ser. No. 12/939,096, filed Nov. 3, 2010, and is a continuation of International Application No. PCT/CN2011/000335, filed Mar. 2, 2011, the entire contents of which are each incorporated by reference herein.

FIELD OF THE DISCLOSURE

The disclosure relates, generally, to surface mount devices and, more particularly, to plastic leaded chip carriers housing LED devices and to LED displays including such devices.

BACKGROUND

In recent years, there have been dramatic improvements in light emitting diode (LED) technology such that LEDs of increased brightness and color fidelity have been introduced. Due to these improved LEDs and improved image processing technology, large format, full color LED video screens have become available and are now in common use. Large format LED displays typically comprise a combination of individual LED panels providing image resolutions determined by the distance between adjacent pixels or "pixel pitch."

Outdoor displays, which are intended for viewing from greater distances, have relatively large pixel pitches and usually comprise discrete LED arrays. In the discrete LED arrays, a cluster of individually mounted red, green, and blue LEDs are driven to form what appears to the viewer as a full color pixel. On the other hand, indoor screens require shorter pixel pitches, such as 3 mm, and comprise panels carrying red, green, and blue LEDs mounted on a single electronic package such as a surface mount device (SMD) package. Each SMD usually defines a pixel. The relatively small SMDs are attached to a driver printed circuit board (PCB) that controls the output of each SMD.

Although both indoor and outdoor displays are viewable across a substantial range of off-axis angles, there is often a perceptible loss of color fidelity with increasing viewing angle. Additionally, the material of each LED package and/or the material used to mount each of the LEDs may have reflective characteristics, which can further decrease color fidelity by creating unwanted light reflection and/or glare.

It is well-known that SMDs and many other types of electronic packages, whether containing integrated circuits or discrete components such as diodes or power transistors, dissipate sufficient heat to require thermal management. Also, excessive heat may cause LEDs failures. Thus, one of the considerations for designing LED system is effective thermal management. One of the objectives of effective thermal management in the design of electronic packaging is to maintain the operating temperature of the LEDs and other active circuit components at an appropriately low enough to prevent premature component failure. Various cooling strategies including conduction heat transfer are in common use. One conventional way of implementing conduction heat transfer for dissipating heat in an electronic package is to allow the heat to conduct away along the leads of the device. However, the leads often do not have sufficient mass or exposed surface area to provide effective heat dissipation. For example, high intensity LEDs that emit light principally in the visible part of the electromagnetic spectrum can generate a significant amount of heat that is difficult to dissipate using such conventional techniques.

The design objectives to increasing the view angle, maintaining a relatively low operating temperature, and decreasing the size of the SMD package are to some extent competitive with each other. It would be desirable to develop a SMD package that addresses all these design objectives with lower cost.

SUMMARY

One embodiment of the surface mount LED package includes a lead frame and a plastic casing at least partially encasing the lead frame. The lead frame includes a plurality of electrically conductive chip carriers. There is an LED disposed on each one of the plurality of electrically conductive chip carriers. A profile height of the surface mount LED package is less than about 1.0 mm.

Another embodiment discloses a surface mount LED package that includes a casing and a lead frame at least partially encased by the casing. The casing includes opposed, first and second main surfaces, opposed side surfaces, and opposed end surfaces. The casing defines a cavity extending into the interior of the casing from the first main surface. The lead frame includes a plurality of electrically conductive chip carriers. There is a single LED on each chip carrying pads of each electrically conductive chip carrier. Each LED has a first electrical terminal and a second electrical terminal. The first electrical terminal of each LED is electrically coupled to the corresponding electrically conductive chip carrier. The second electrical terminal of each LED is electrically coupled to the connection pad of a corresponding one of the plurality of electrically conductive connection parts. A depth of the cavity is less than about 0.6 mm. In some embodiments, the depth is less than about 0.55 mm. In others the, depth is less than about 0.5 mm. In yet others, the depth is less than about 0.45 mm, and in still others less than about 0.4 mm. In certain embodiments, the profile height is less than 1 mm. In some embodiments, the profile height is less than about 0.95 mm. In yet other embodiments, the profile height is less than about 0.90 mm, and in still other embodiments, the profile height is less than about 0.85 mm.

Yet another embodiment discloses an LED display including a substrate carrying an array of surface mount devices (SMDs) arranged in vertical columns and horizontal rows. Each of the SMDs includes a casing and a plurality of LEDs configured to be energized to produce in combination a substantially full range of colors and to define one pixel of the display. The LED display further includes signal processing and LED drive circuitry electrically connected to selectively energize the array of SMDs for displaying images on the LED display. Each pixel of the display has a size about 2.8 mm or less by about 2.8 mm or less.

DETAILED DESCRIPTION

The following description presents preferred embodiments of the disclosure representing the best mode contemplated for practicing the disclosure. This description is not to be taken in a limiting sense but is made merely for the purpose of describing the general principles of the disclosure, the scope of which is defined by the appended claims.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

In certain embodiments, a LED package is provided with multiple LEDs, and each LED is electrically coupled to a separate input terminal and output terminal. As such, the LED die are independently controllable and can be operated more efficiently. In certain embodiments, the LED package comprises a lead frame with a polymer, e.g., plastic, casing molded about the lead frame. The polymer casing comprising opposed, first and second main surfaces having a height distance therebetween, opposed side surfaces having a width distance therebetween, and opposed end surfaces having a length distance therebetween, wherein the height distance, the width distance and the length distance are less than about 2.6 mm. In certain embodiments, the distances are about 2.5 mm or less and still other embodiments about 2.35 mm or less. In certain embodiments, the casing at least partially encases the lead frame and defines a cavity extending into the interior of the casing from the first main surface, at least a portion of the electrically conductive chip carrier is exposed at the floor of the cavity. The ratio of the area of the cavity floor over the area of the main surface is at least 35%. In some embodiments, it is greater than 40%. In still other embodiments, the ratio is greater than 50%.

In certain embodiments, the light emitting diode package comprises multiple LED die, e.g. a red LED die, a green LED die and a blue LED die, and the lead frame comprises a conductive chip carrier for each LED. In certain embodiments, each conductive chip carrier has a length extending at least over ½ of a cavity floor length. The common mounting pad will have increased area to improve heat dissipation.

Figure 1:
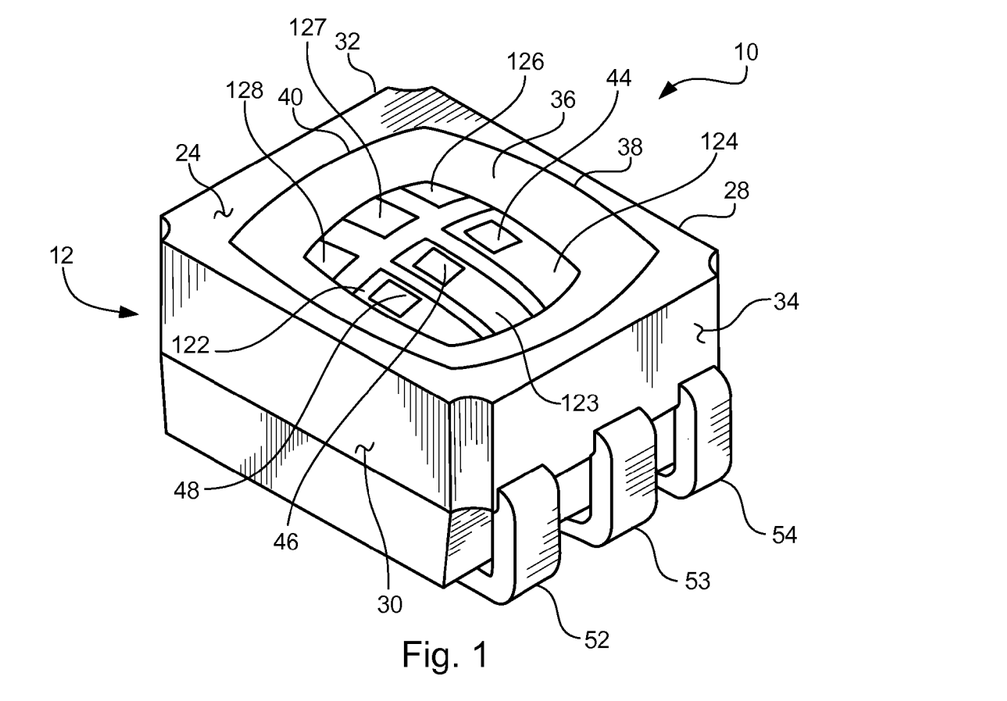
FIG. 1 is a perspective view of a surface mount device according to an embodiment of the present disclosure.
Figure 2:
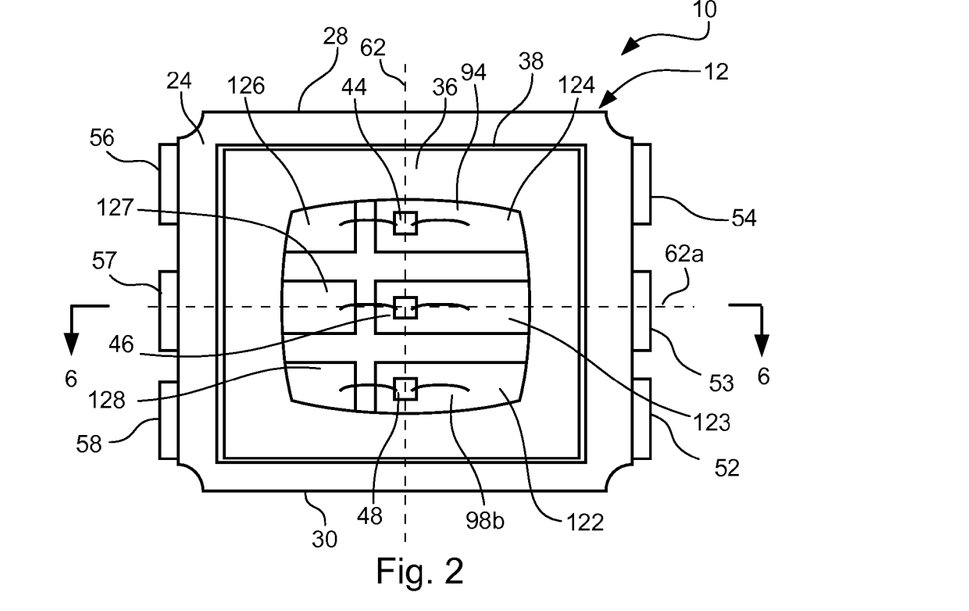
FIG. 2 is a top plan view of the embodiment shown in FIG. 1.
Figure 3:
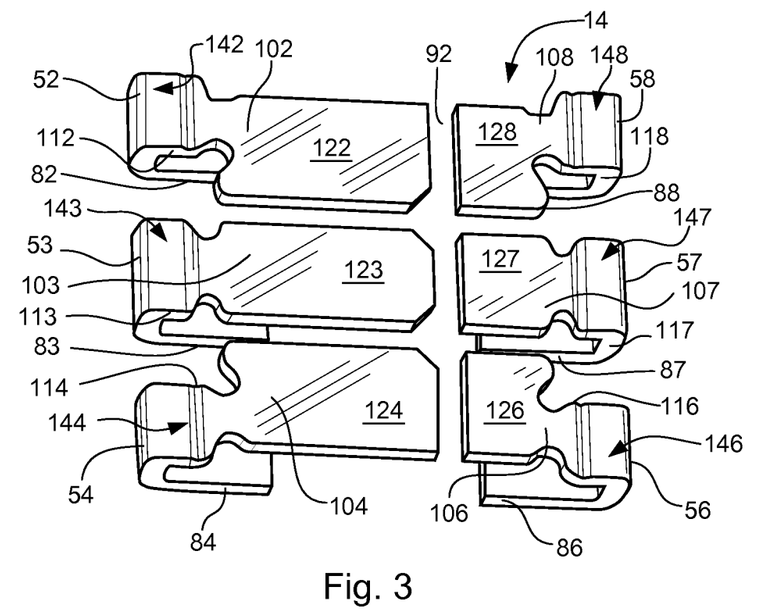
FIG. 3 is a perspective view of a lead frame in accordance with one embodiment that may be used in a surface mount device.
Figure 4:
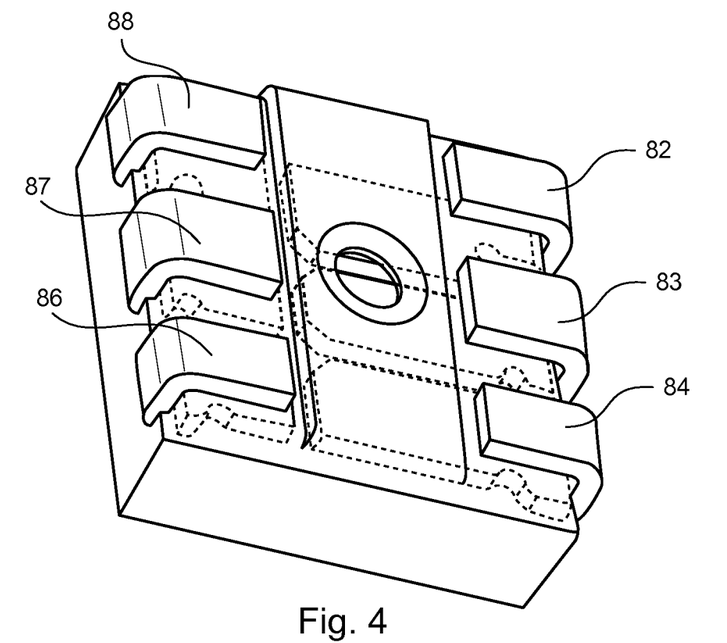
FIG. 4 is a perspective bottom view of the embodiment shown in FIG. 1.
Figure 5:
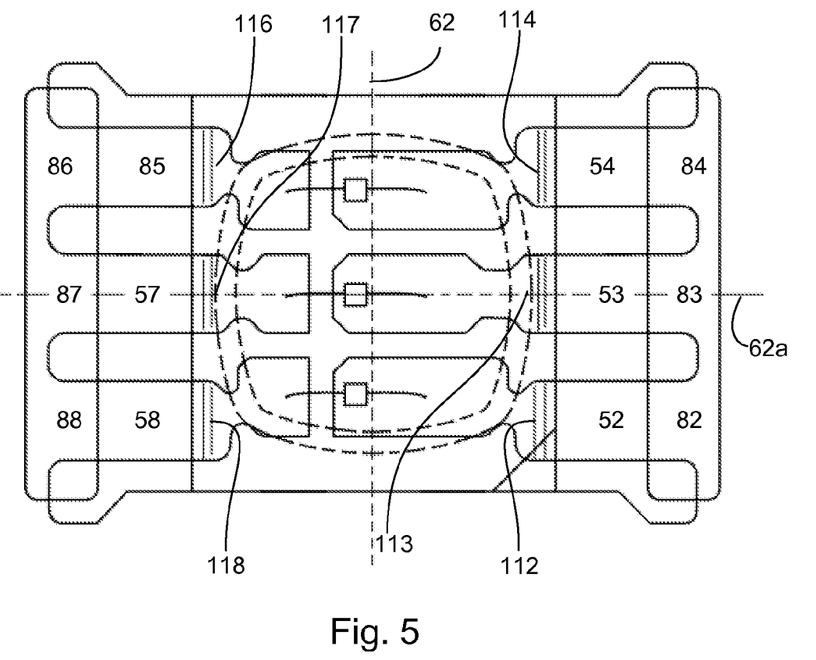
FIG. 5 is a top view of the lead frame shown in FIG. 3.

FIGS. 1-4 depict a surface mount LED package 10 and parts thereof according to specific, exemplary embodiments for use in LED displays such as indoor and/or outdoor LED screens. The LED package 10 includes a plastic casing 12 that is at least partially encasing a lead frame 14. The lead frame 14 comprises first, second, and third electrically conductive chip carriers 142, 143, and 144 and first, second, and third electrically conductive connection parts 146, 147, and 148 separate from the electrically conductive chip carrier as illustrated in FIG. 3. The electrically conductive chip carriers 142-144 have a profile height ranging from about 0.42 mm to about 0.48 mm. In other words, the profile height is the height of the bent lead frame. For example, in FIG. 3, the profile height refers to the distance between the lower surface 82 of the electrically conductive chip carrier 142 and the upper surface 102 of the electrically conductive chip carrier 142. In some embodiments, the profile height is less than about 1.0 mm. In yet other embodiments, the profile height is less than about 0.95 mm. In still other embodiments, the profile height is about 0.85 mm to about 0.95 mm. The lead frame metal sheet, before bending, may have a sheet thickness of less than about 0.15 mm.

Each of the first, second, and third electrically conductive chip carrier has an upper surface including a connection pad. For example, the first electrically conductive chip carrier has 144 has an upper surface 104 including a connection pad 124. An LED 44 is disposed on the connection pad 124 on the upper surface 104 of the electrically conductive chip carrier 144. An LED 46 is disposed on the connection pad 123 of the upper surface 103. An LED 48 is disposed on the connection pad 122 of the upper surface 102. Each LED has a first electrical terminal and a second electrical terminal. The first electrical terminal is defined as an anode. For example, the first LED 44 has an anode electrically coupled to the first electrically conductive chip carrier 146. The second and third LED 46 and 48 each has an anode electrically coupled to the second and third electrically conductive chip carrier 147 and 148, respectively.

Each of the first, second and third electrically conductive connection parts has an upper surface, a lower surface, and a connection pad on the upper surface. Each electrically conductive chip carrier has an upper surface, a lower surface, and a chip carrying pad on the upper surface, each electrically conductive connection part has an upper surface, a lower surface, and a connection pad on the upper surface. For example, in FIG. 3, the first electrically conductive connection part 146 has an upper surface 106, a lower surface 86, and a connection pad 126 on the upper surface 106. The second electrically conductive connection part 147 has an upper surface 107, a lower surface 87, and a connection pad 127 on the upper surface 107. The third electrically conductive connection part 148 has an upper surface 108, a lower surface 88, and a connection pad 128 on the upper surface 108. The first electrically conductive chip carrier 142 has an upper surface 102, a lower surface 82, and a connection pad 122 on the upper surface 102. The second electrically conductive chip carrier 143 has an upper surface 103, a lower surface 83, and a connection pad 123 on the upper surface 103. The third electrically conductive chip carrier 144 has an upper surface 104, a lower surface 84, and a connection pad 124 on the upper surface 104. The lower surfaces of the electrically conductive chip carriers and connection pads may also be referred to as pin pads. For example, the lower surface 86-88 of each of the electrically conductive connection parts 146-148 and the lower surface 82-84 of each of the electrically conductive chip carriers 142-144 may each have a pad area of about 0.4 mm by about 0.7 mm.

The first and second electrically conductive chip carriers 142 and 143 are adjacent to each other and the second and third electrically conductive chip carriers 143 and 144 are adjacent to each other. The adjacent electrically conductive chip carriers are separated by a carrier gap and have asymmetrical upper surface contours with respect to a middle line in the carrier gap. The first and second electrically conductive connection parts 146 and 147 are adjacent to each other. The second and third electrically conductive connection parts 147 and 148 are adjacent to each other. The adjacent electrically conductive connection parts are separated by a connection gap and have asymmetrical upper surface contours with respect to a middle line in the connection gap.

The casing 12 may be generally rectangular, including opposed, first and second main surfaces 24 and 26, respectively, opposing respective side surfaces 28 and 30, and end surfaces 32 and 34. The first and second surfaces may also be referred to as the upper and lower surfaces. In one embodiment, the distance between the upper and lower surfaces 24 and 26, or the package profile height is less than about 1.0 mm. Preferably, the distance h between the upper and lower main surfaces 24 and 26 is about 0.90 mm to about 1.00 mm. More preferably, the distance h between the upper and lower main surfaces 24 and 26 is about 0.95 mm. The distance w between the side surfaces 28 and 30 and distance l between the end surfaces 32 and 34 are preferably less than about 2.6 mm. Preferably, the distance w between the side surfaces 28 and 30 is about 2.40 mm to about 2.60 mm, and the distance l between the end surfaces 32 and 34 also ranges between about 2.40 mm to about 2.60 mm. More preferably, the distance w between the side surfaces 28 and 30 is about 2.50 mm, and the distance l between the end surfaces 32 and 34 is about 2.50 mm.

By way of example and not limitation, the surface mount LED package 10 may have an overall length L of about 2.5 mm, an overall width W of about 2.5 mm, and a height H of 0.95 mm.

The plastic casing 12 further defines a recess or cavity 36 extending from the upper surface 24 into the body of the plastic casing 12. In some embodiments, a reflective insert or ring 38 may be positioned and secured along at least a portion of a side or wall 40 of the cavity 36. Also, the reflective insert or ring 38 may be integral with the plastic casing 12 and may be made from the same material as the plastic casing 12. The effectiveness of the reflectivity of the ring 38 is preferably enhanced by tapering the cavity 36 and ring 38 carried therein inwardly toward the interior of the casing. The preferred shape of the cavity 36 is a square-like or rectangular shaped cavity. The square-like shape results in a surface mount LED package 10 with a more uniform wall thickness on each side of the side surfaces 28 and 30 and end surfaces 32 and 34. Thus, in accordance with an aspect of the disclosure, the size of the cavity is increased compared to, for example, circular shaped cavities.

The casing 12 is fabricated from materials that are both electrically insulating and thermally conductive. In one embodiment, the casing is a thermoplastic polycondensate. A particularly preferred thermoplastic polycondensate is polyphthalamide (PPA). In a preferred embodiment, the casing 12 may be formed of black PPA or white PPA. It has been found that the use of black material in image generation SMD packages, such as with SMDs employed in video displays, improves contrast. Other casing materials include ceramics, resins, epoxies, and glass.

In the illustrative embodiment of FIGS. 1 and 2, the three LEDs 44, 46, 48 in the surface mount LED package 10 preferably emit red, green and blue colors, respectively, so that when appropriately energized the LEDs produce in combination a substantially full range of colors. Also, two or more of the LEDs may emit the same color, including white. For example, the LED 44 and the LED 46 may both emit red light. The LED chips may have a square like size or rectangular size. For example, the square like LED chip may have a profile height less than bout 0.11 mm, or in the range of about 0.09 mm to about 0.11 mm, or less than about 0.1 mm, or in the range of about 0.08 to 0.10 mm. The square like LED chip may have a profile width of less than about 0.32 mm, or in the range of 0.265 mm to 0.315 mm. The square like LED chip may have a profile width of less than about 0.38 mm, or in the range of 0.33 mm to 0.38 mm. The rectangular like LED chip may have a profile height of less than about 0.13 mm, or in the range of about 0.10 mm to about 0.13 mm. The rectangular like LED chip may have a profile width of less than about 0.28 mm, or in the range of about 0.20 mm to about 0.28 mm. The rectangular like LED chip may have a profile width of less than about 0.36 mm, or in the range of about 0.28 mm to about 0.36 mm.

In the illustrative embodiment, the red LED 44 is disposed on the first electrically conductive chip carrier 142. The green LED 46 is disposed on the second electrically conductive chip carrier 143 near the center of the cavity 36. The blue LED 48 is disposed on the third electrically conductive chip carrier 144. To dissipate heat from the LEDs, it is preferable to increase the upper surface area of the upper surfaces of the electrically conductive chip carriers so they can dissipate heat more effectively. For example, the upper surface area of each electrically conductive chip carrier is about twice the upper surface area of the corresponding connection part.

The LED chips 44, 46, 48 extend in a transverse direction along a first axis 62, that is, in a direction perpendicular to the side surfaces 28 and 30. The leads 50, 52, 54, 56 are parallel to each other and extend in a direction perpendicular to the direction 62 along a second axis 62a. The first axis and the second axis cross each other near the center of the second LED chip 46.

In this embodiment, the electrically conductive connection parts are designed by providing bond pads, mold flowing, heat dissipation and chip position so that the heat dissipation from the red LED 44 is improved compared with prior disclosures, such as disclosed in the applicants co-pending U.S. patent application Ser. No. 12/321,059, the disclosure of which is incorporated by reference herein. Referring to FIGS. 1-4, enhanced heat dissipation is realized by a larger surface area of each pin pads. For example, each lower surface 86-88 of the electrically conductive connection parts 146-148 are increased more than 10%. The surface area of each lower surface 82-84 of the electrically conductive chip carriers also are increased more than 10%. More specifically, the surface area of the lower surfaces 83 and 87 are increased about 40%.

At the same time, to make sure that the PPA fluid flows uniformly in each direction when forming the casing 12, the contours 112 and 116 of the upper surfaces 104 and 104 are asymmetrical with respect to the second axis 62a. Similarly, the contours 116 and 117 of the adjacent upper surface of the first and second electrically conductive connection parts 146 and 147 are asymmetrical with respect to the gap between the connection parts 146 and 147. The contours 117 and 118 of the adjacent upper surface of the second and third electrically conductive connection parts 147 and 148 are asymmetrical with respect to the gap between the connection parts 147 and 148. Similarly, the contours of adjacent chip carriers are also asymmetrical with respect to the gap between the adjacent chip carriers such as 122-123 and 123-124.

The electrically conductive connection parts 146, 147, and 148 include enlarged electrical connection pads 126, 127, 128, respectively, positioned in the central region 58 adjacent to, but spaced apart from, the component carrying upper surfaces 102-104 of the chip carriers. In a preferred form of the surface mount LED package 10, the leads 52, 54, 56, and 58 are bent to extend outside of and along their respective end surfaces 32 and 34 of the casing, then bent again so that lower surfaces 82-84 and 86-88 of the leads extend along the lower surface 26 of the plastic casing 12. The outwardly facing surfaces of the lower surfaces 82-84 and 86-88 of the leads and the bottom surface of a thermal conductive body are substantially flush to facilitate connection to an underlying substrate. The lower surfaces 82-84 and 86-88 of the leads are electrically connected or bonded to traces or pads on the substrate using any of a number of well-known connection techniques, including soldering.

Figure 6:
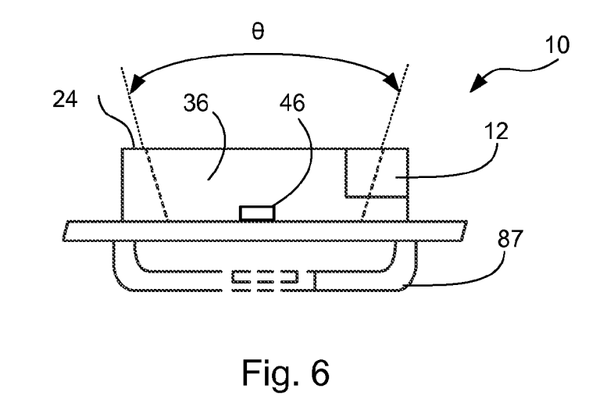
FIG. 6 is a cross-sectional view of the embodiment of FIG. 2 taken along section line 6-6.

In a preferred embodiment, solder pads are included on the bottom of the end portions such that no solder is visible when viewing each individual SMD from the top. This is advantageous as it helps to prevent glare and improve contrast, particularly during daylight viewing. As illustrated in FIGS. 1 and 6, the cavity 36 extends into the casing interior a sufficient depth to expose the connection part pads 122-124 and 126-128.

The particular dimensions of the lower surfaces 82-84 and 86-88 of the leads 52-54 and 56-88 that extend inwardly from the end surfaces 32 and 34 of the casing may depend on the intended implementation of the surface mount LED package, the LEDs to be utilized, the material of the casing 12, the size of the SMD and/or other such factors and/or combinations of factors. In some embodiments, each of the leads 50-52, 54-56 exterior of the casing may be separated by gaps 92 between pads to electrically isolate the connection parts from each other.

The plurality of electrically conductive chip carriers 142, 143, and 144 and the plurality of electrically conductive connection parts 146, 147, 148 may be made from an electrically conductive metal or metal alloy, such as copper, a copper alloy, other suitable low resistivity, corrosion resistant materials, or combinations of these materials. Because the LED chips are disposed on the electrically conductive chip carriers 142-144, a large surface area of the upper surface 102-104 may help heat dissipation.

Each of the LEDs 44, 46, and 48 may be electrically independently coupled with different connection pad by means of an electrically and thermally conductive interface 100 such as a solder, adhesive, coating, film, encapsulant, paste, grease and/or other suitable material. In a preferred embodiment, the LEDs 44, 46, and 48 may be electrically coupled and secured to the connection pad 122-124 using a solder pad on the bottom of the LEDs such that the solder is not visible from the top. Preventing the solder from being seen from the top is advantageous so as to reduce reflection and provide better contrast, particularly during the day time.

In certain manufacturing methods in accordance with the disclosure, the LEDs 44, 46, and 48 may be coupled to the connection pads 122-124 prior to molding and/or assembling the casing 12 about the connection pads. Alternatively, the LEDs may be coupled to the connection pads 122-124 after the connector parts have been partially encased within the casing. The cavity 36 that extends into the casing may be configured so that sufficient portions of the pads 122-124 and 126-128 are exposed to receive the LEDs and the associated wire bonds.

Figure 7:
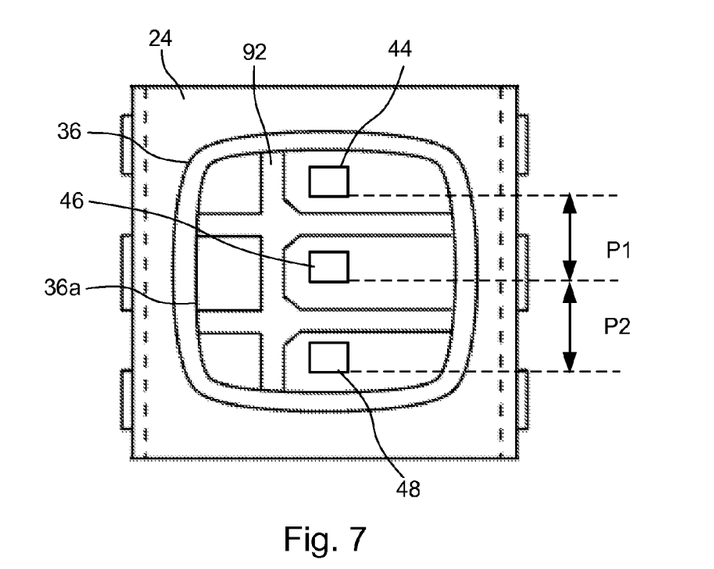
FIG. 7 is a top view of one embodiment of a surface mount device.

With reference now to FIGS. 6-7, some examples of the various components of an SMD package for LED 10 are illustrated. By way of example and not by limitation, the dimensions described below in association with the embodiment illustrated in FIGS. 6-7 may also apply to the surface mount package in FIGS. 1-5.

In the illustrative embodiment of FIG. 6, either the width or the length of the SMD package 10 is less than about 2.6 mm. Preferably, the width or length of the SMD is about 2.4 mm to about 2.6 mm. More preferably, the width or length of the SMD is about 2.5 mm. The profile height of the SMD package 10 is less than about 1.0 mm. Preferably, the profile height of the SMD is in the range of about 0.9 mm to about 1.0 mm. More preferably, the profile height of the SMD is about 0.95 mm. The cavity 36 has an opening width about 1.86 mm to about 1.96 mm in the upper surface and a width in the range of about 1.59 to about 1.69 mm in the lower surface. Preferably, the cavity 36 has an opening width of about 1.91 mm in the upper surface and a width of about 1.64 mm in the lower surface. The angle θ between the two side surfaces of the cavity is in the range of about 25.0° to about 35.00°, preferably at about 30.0°. A width of the cavity opening 36 in the first main surface 24 is in the range of about 1.4 mm to about 1.55 mm. The opening of the cavity 36 in the first main surface has an area larger than about 55% and less than about 61% of a total area of the first main surface 24. The casing surround the cavity has a wall thickness in the range of about 0.3 mm to about 0.45 mm. Specifically, the wall thickness of the casing is thinner near the first main surface 24 than the wall thickness of the casing near the connection pad 60.

In FIG. 7, the three LEDs 44, 46, and 48 have a pitch distance P1 or P2 of about 0.3 mm to about 0.4 mm. Each of the LEDs 44, 46, and 48 may have a profile width about 0.3 mm to about 0.4 mm. Each of the LEDs 44, 46, and 48 may have a profile length about 0.3 mm to about 0.4 mm. In certain embodiments, the pitch distance is less than about 0.3 mm and the profile width is less than about 0.3 mm. The gaps 92 may have a width about 0.13 to about 0.17 mm. The ratio of the area of the cavity floor 36a over the area of the main surface 24 is at least 35%. In some embodiments, the ratio is greater than 40%. In still other embodiments, the ratio is greater than 50%.

Figure 8:
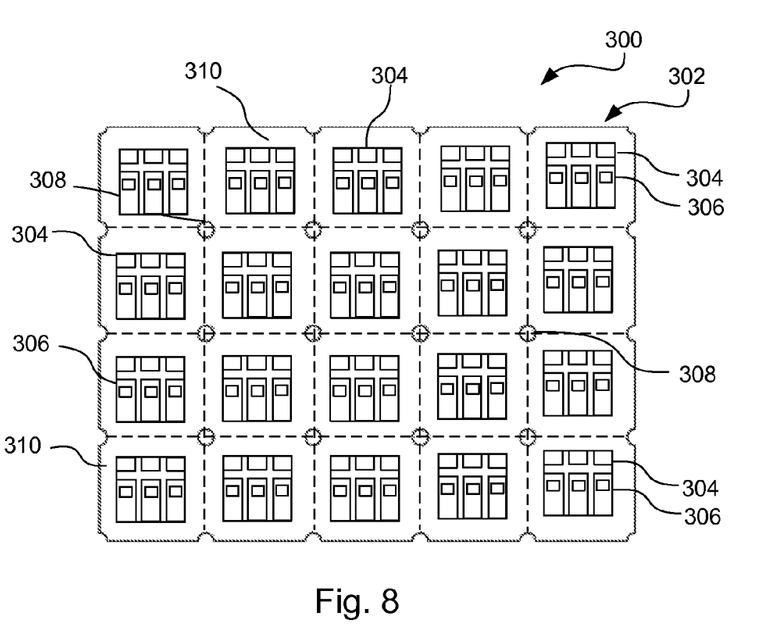
FIG. 8 is a front elevation view of a portion of an LED display screen incorporating surface mount devices in accordance with embodiments of the present disclosure.

FIG. 8 schematically illustrates a portion of an LED display screen 300, for example, an indoor screen comprising, in general terms, a driver PCB 302 carrying a large number of surface-mount devices 304 arranged in rows and columns, each SMD defining a pixel. Each pixel of the display has a size about 2.8 mm by about 2.8 mm. Each LED chip may be driven by different voltage levels. For example, the red LED may be driven by 2.2 V power source while the blue and green LEDs may be driven by a power source around 3.1 V. The SMDs 304 may include devices such as those described above and illustrated in FIGS. 1-7. The SMD devices 304 are electrically connected to traces or pads on the PCB 302 connected to respond to appropriate electrical signal processing and driver circuitry (not shown).

As disclosed above, each of the SMDs carries a vertically oriented, linear array 306 of red, green and blue LEDs. Such a linear orientation of the LEDs has been found to improve color fidelity over a wide range of viewing angles. Throughholes 308 may also be provided to allow for better and shorter contact for the ceramic SMD body to the PCB. Through-holes 308 also allow for improved thermal dissipation.

From the foregoing, it can be seen that the present embodiments provide a mini surface mount LED package including a plurality of LEDs on a lead frame partially encased by a plastic casing. The lead frame includes a plurality of electrically conductive chip carriers and a plurality of electrically conductive connection parts. The upper surfaces of each pair of adjacent electrically conductive chip carriers or adjacent connection parts have asymmetrical contours with respect to a middle line in the gap between the adjacent electrically conductive chip carriers or adjacent connection parts. The disclosed mini surface mount LED package has relatively large pin pads, lower operating temperature, and lower manufacturing cost compared with previous disclosures.

It is therefore intended that the foregoing detailed description be regarded as illustrative rather than limiting, and that it be understood that it is the following claims, including all equivalents, that are intended to define the spirit and scope of this disclosure.

We claim:

1. A light emitting diode (LED) package comprising:
a lead frame comprising a plurality of electrically conductive chip carriers;
an LED disposed on each one of the plurality of electrically conductive chip carriers, each LED having a first electrical terminal and a second electrical terminal, wherein the first electrical terminal of each LED is electrically coupled to the corresponding electrically conductive chip carrier;
a plastic casing at least partially encasing the lead frame; and
a plurality of electrically conductive connection parts separate from the plurality of electrically conductive chip carriers, each electrically conductive chip carrier having an upper surface, a lower surface, and a chip carrying pad on the upper surface, each electrically conductive connection part having an upper surface, a lower surface, and a connection pad on the upper surface, wherein the electrically conductive chip carriers and the electrically conductive connection parts comprise sheet metal,
wherein the second electrical terminal of each LED is electrically coupled to a connection pad of a corresponding one of a plurality of electrically conductive connection parts,
wherein a profile height of the LED package is less than 1.0 mm, and
wherein a surface area of the upper surface of each electrically conductive connection part is less than about one half of a surface area of the upper surface of each electrically conductive chip carrier.

2. The LED package of claim 1, wherein the LED package has a width of less than about 2.6 mm, and wherein the LED package has a length of less than about 2.6 mm.

3. The LED package of claim 1, wherein the first and second electrical terminals of each of the plurality of LEDs comprise a cathode and an anode, respectively.

4. The LED package of claim 3, wherein the second electrical terminal of each of the plurality of LEDs is electrically coupled to the connection pad of the corresponding electrically conductive connection part by a single wire bond.

5. The LED package of claim 4, wherein the lower surface of each of the electrically conductive connection parts and the electrically conductive chip carriers have a pad area of about 0.4 mm by about 0.7 mm.

6. The LED package of claim 4, wherein the chip carrying pad has a same profile width as the corresponding conductive connection pad.

7. The LED package of claim 1, wherein the plastic casing comprises a square-like or rectangular cavity having a depth about 0.5 mm.

8. The LED package of claim 1, wherein each of the electrically conductive chip carriers supports a single LED that individually emits red, green, or blue light.

9. The LED package of claim 1, wherein the plastic casing comprises a thermoplastic.

10. The LED package of claim 9, wherein the plastic casing comprises one of a white polyphthalamide or a black polyphthalamide.

11. The LED package of claim 1, wherein the lead frame comprises a plurality of leads bent to extend outside of and along a bottom surface of the plastic casing, the leads comprising the electrically conductive chip carriers on an opposite side of the bottom surface.

12. The LED package of claim 1, wherein the LEDs extend along an axis, wherein a gap extending parallel with the axis separates the plurality of electrically conductive connection parts from the plurality of electrically conductive chip carriers such that all of the plurality of electrically conductive connection parts is on one side of the gap and all of the plurality of electrically conductive chip carriers is on the other side of the gap.

13. The LED package of claim 12, wherein adjacent electrically conductive chip carriers have asymmetrical upper surface contours with respect to a middle line of a carrier gap separating the adjacent electrically conductive chip carriers, the carrier gap extending perpendicular to the gap separating the plurality of electrically conductive connection parts from the plurality of electrically conductive chip carriers.

14. A device comprising:
- a casing comprising opposed, first and second main surfaces, opposed side surfaces, and opposed end surfaces, the casing defining a cavity extending into the interior of the casing from the first main surface; and
- a lead frame at least partially encased by the casing, the lead frame comprising a plurality of electrically conductive chip carriers;
- a single LED on a chip carrying pad of each electrically conductive chip carrier, each LED having a first electrical terminal and a second electrical terminal, wherein the first electrical terminal of each LED is electrically coupled to the corresponding electrically conductive chip carrier; and
- a plurality of electrically conductive connection parts separate from the plurality of electrically conductive chip carriers, each electrically conductive chip carrier having an upper surface, a lower surface, and a chip carrying pad on the upper surface, each electrically conductive connection part having an upper surface, a lower surface, and a connection pad on the upper surface, wherein the electrically conductive chip carriers and the electrically conductive connection parts comprise sheet metal,
- wherein the second electrical terminal of each LED is electrically coupled to a connection pad of a corresponding one of a plurality of electrically conductive connection parts,
- wherein a depth of the cavity is less than 0.6 mm and a profile height of the surface mount device is less than 1.00 mm, and
- wherein a surface area of the upper surface of each electrically conductive connection part is less than about one half of a surface area of the upper surface of each electrically conductive chip carrier.

15. The device of claim 14, wherein the first and second electrical terminals of each LED comprise a cathode and an anode, respectively.

16. The device of claim 14, wherein the first and second electrical terminals of each LED comprise a cathode and an anode, respectively, and wherein each LED emits red, green, or blue light.

17. The device of claim 16, wherein the second electrical terminal of each LED is electrically coupled to the connection pad of the corresponding electrically conductive connection part by a single wire bond.

18. The device of claim 14, wherein the lower surface of each of the electrically conductive connection parts and the electrically conductive chip carriers have a pad area larger than about 0.4 mm by about 0.7 mm.

19. The device of claim 14, wherein the cavity has an opening angle about 30° in a vertical direction.

20. The device of claim 14, wherein the LEDs extend in a first direction along a center axis of the surface mount device.

21. The device of claim 14, wherein the electrically conductive chip carrier proximate to a center line of the surface mount device has a width of about 0.47 mm to 0.53 mm.

22. The device of claim 14, wherein the LEDs extend along an axis, wherein a gap extending parallel with the axis separates the plurality of electrically conductive connection parts from the plurality of electrically conductive chip carriers such that all of the plurality of electrically conductive connection parts is on one side of the gap and all of the plurality of electrically conductive chip carriers is on the other side of the gap.

23. The device of claim 22, wherein adjacent electrically conductive chip carriers have asymmetrical upper surface contours with respect to a middle line of a carrier gap separating the adjacent electrically conductive chip carriers, the carrier gap extending perpendicular to the gap separating the plurality of electrically conductive connection parts from the plurality of electrically conductive chip carriers.

24. An LED display comprising:
- a substrate carrying an array of surface mount devices (SMDs) arranged in vertical columns and horizontal rows, each of the SMDs comprising a casing and containing a plurality of LEDs configured to be energized to produce in combination a substantially full range of colors and to define one pixel of the display; and
- signal processing and LED drive circuitry electrically connected to selectively energize the array of SMDs for displaying images on the LED display,
- wherein each SMD further comprises a lead frame at least partially encased in a respective casing, each lead frame comprising:
  - a plurality of electrically conductive chip carriers; and
  - a plurality of electrically conductive connection parts separate, from the plurality of electrically conductive chip carriers, each electrically conductive chip carrier having an upper surface, a lower surface, and a chip carrying pad on the upper surface, each electrically conductive connection part having an upper surface, a lower surface, and a connection pad on the upper surface, wherein the electrically conductive chip carriers and the electrically conductive connection parts comprise sheet metal,
- wherein each LED has a first electrical terminal and a second electrical terminal, wherein the first electrical terminal of each LED is electrically coupled to the corresponding electrically conductive chip carrier,
- wherein the second electrical terminal of each LED is electrically coupled to a connection pad of a corresponding one of a plurality of electrically conductive connection parts,
- wherein a surface area of the upper surface of each electrically conductive connection part is less than about one half of a surface area of the upper surface of each electrically conductive chip carrier,
- wherein each pixel of the display has a size about 2.8 mm or less by about 2.8 mm or less; and
- wherein a profile height of the SMD is less than 1.0 mm.

25. The LED display of claim 24, wherein for each of the SMDs, the LEDs extend along an axis, wherein a gap extending parallel with the axis separates the plurality of electrically conductive connection parts from the plurality of electrically conductive chip carriers such that all of the plurality of electrically conductive connection parts is on one side of the gap and all of the plurality of electrically conductive chip carriers is on the other side of the gap.

26. The LED display of claim 25, wherein for each of the SMDs, adjacent electrically conductive chip carriers have asymmetrical upper surface contours with respect to a middle line of a carrier gap separating the adjacent electrically conductive chip carriers, the carrier gap extending perpendicular to the gap separating the plurality of electrically conductive connection parts from the plurality of electrically conductive chip carriers.

27. A light emitting diode (LED) package comprising:
a lead frame comprising a plurality of electrically conductive chip carriers;
an LED disposed on each one of the plurality of electrically conductive chip carriers, each LED having a first electrical terminal and a second electrical terminal, wherein the first electrical terminal of each LED is electrically coupled to the corresponding electrically conductive chip carrier;
a polymer casing at least partially encasing the lead frame, the polymer casing comprising opposed, first and second main surfaces having a height distance therebetween, opposed side surfaces having a width distance therebetween, and opposed end surfaces having a length distance therebetween, wherein the height distance is less than 1.0 mm, and wherein the width distance and the length distance are less than about 2.6 mm; and
a plurality of electrically conductive connection parts separate from the plurality of electrically conductive chip carriers, each electrically conductive chip carrier having an upper surface, a lower surface, and a chip carrying pad on the upper surface, each electrically conductive connection part having an upper surface, a lower surface, and a connection pad on the upper surface, wherein the electrically conductive chip carriers and the electrically conductive connection parts comprise sheet metal,
wherein the second electrical terminal of each LED is electrically coupled to a connection pad of a corresponding one of a plurality of electrically conductive connection parts, and
wherein a surface area of the upper surface of each electrically conductive connection part is less than about one half of a surface area of the upper surface of each electrically conductive chip carrier.

28. The LED package of claim 27 wherein the casing at least partially encases the lead frame and defines a cavity extending into the interior of the casing from the first main surface to a floor of the cavity and the ratio of the area of the cavity floor over the area of the main surface is at least 35%.

29. The LED package of claim 27 comprising a red LED die, a green LED die and a blue LED die.

30. The LED package of claim 27 wherein the casing at least partially encases the lead frame and defines a cavity extending into the interior of the casing from the first main surface to a floor of the cavity, and each electrically conductive chip carrier has a length extending at least over ½ of a cavity floor length.

31. The LED package of claim 27, wherein the LEDs extend along an axis, wherein a gap extending parallel with the axis separates the plurality of electrically conductive connection parts from the plurality of electrically conductive chip carriers such that all of the plurality of electrically conductive connection parts is on one side of the gap and all of the plurality of electrically conductive chip carriers is on the other side of the gap.

32. The LED package of claim 31, wherein adjacent electrically conductive chip carriers have asymmetrical upper surface contours with respect to a middle line of a carrier gap separating the adjacent electrically conductive chip carriers, the carrier gap extending perpendicular to the gap separating the plurality of electrically conductive connection parts from the plurality of electrically conductive chip carriers.

* * * * *